(12) United States Patent
Tsunoda

(10) Patent No.: US 9,193,093 B2
(45) Date of Patent: Nov. 24, 2015

(54) METHOD FOR SIMULATING MULTIPHASE FLOW OF PLASTIC MATERIAL AND GAS

(71) Applicant: SUMITOMO RUBBER INDUSTRIES, LTD., Kobe-shi, Hyogo (JP)

(72) Inventor: Masaya Tsunoda, Kobe (JP)

(73) Assignee: SUMITOMO RUBBER INDUSTRIES, LTD., Kobe-Shi (JP)

(*) Notice: Subject to any disclaimer, the term of this patent is extended or adjusted under 35 U.S.C. 154(b) by 366 days.

(21) Appl. No.: 13/687,892

(22) Filed: Nov. 28, 2012

(65) Prior Publication Data

US 2013/0188438 A1    Jul. 25, 2013

(30) Foreign Application Priority Data

Jan. 23, 2012 (JP) .................. 2012-011317

(51) Int. Cl.
*G06F 7/60* (2006.01)
*G06F 17/10* (2006.01)
*B29B 7/00* (2006.01)
*G06F 17/50* (2006.01)

(52) U.S. Cl.
CPC ............ *B29B 7/002* (2013.01); *G06F 17/5018* (2013.01)

(58) Field of Classification Search
CPC ...... G06F 17/5018; G06T 17/20; B29B 7/002
USPC ............................................................ 703/2
See application file for complete search history.

(56) References Cited

U.S. PATENT DOCUMENTS

| 6,199,026 | B1* | 3/2001 | Shiraishi et al. .............. 702/140 |
| 2002/0070469 | A1* | 6/2002 | Hiatt et al. .................. 264/40.1 |
| 2010/0010795 | A1* | 1/2010 | Fevrier et al. ..................... 703/8 |

OTHER PUBLICATIONS

Cheng, J. J., & Manas-Zloczower, I. (1989). Hydrodynamic analysis of a banbury mixer 2-D flow simulations for the entire mixing chamber. Polymer Engineering & Science, 29(15), 1059-1065.*

Ghoreishy, M. H. R., & Nassehi, V. (1997). Modeling the transient flow of rubber compounds in the dispersive section of an internal mixer with slip-struck boundary conditions. Advances in Polymer Technology, 16(1), 45-68.*

Connelly, R. K., & Kokini, J. L. (2006). Mixing simulation of a viscous Newtonian liquid in a twin sigma blade mixer. AIChE journal, 52(10), 3383-3393.*

Petera, J., & Nassehi, V. (1996). Finite element modelling of free surface viscoelastic flows with particular application to rubber mixing. International journal for numerical methods in fluids, 23(11), 1117-1132.*

Collin, et al., "Numerical and Experimental Study of Dispersive Mixing of Agglomerates", Society of Plastics Engineers Annual Technical Conference 2006, ANTEC 2006, 5 pages.

* cited by examiner

*Primary Examiner* — Aniss Chad
(74) *Attorney, Agent, or Firm* — Birch, Stewart, Kolasch & Birch, LLP

(57) ABSTRACT

A computerized method for simulating a fluidized state of a plastic material in a chamber, comprises steps of: generating a chamber model which is a finite volume model of the chamber; defining a material model of the plastic material; defining a gas-phase model of gas; and making a flow calculation of the material model and the gas-phase model which are in the chamber model, wherein the material model is provided with viscosity of the plastic material, and the gas-phase model is provided with viscosity which is more than the actual viscosity of the gas.

4 Claims, 8 Drawing Sheets

METHOD FOR SIMULATING MULTIPHASE FLOW OF PLASTIC MATERIAL AND GAS

BACKGROUND OF THE INVENTION

The present invention relates to a computerized method for simulating a multiphase flow of a plastic material and a gas, which is helpful to analyze fluidized states of a plastic material such as uncured rubber, resin and the like kneaded in a chamber.

In recent years, various computerized simulation methods have been proposed. For example, the following non-patent document 1 proposed a method to compute fluidized states of a plastic material such as uncured rubber or resin before cross-linked when kneaded in a banbury mixer.

[non-patent document 1] "Numerical and Experimental study of Dispersive mixing of Agglomerates", V. Collin (1)*, E. Peuvrel-Disdier (1) et al.

The method of the non-patent document 1 is premised on that the chamber is completely filled with the plastic material (namely, filling rate=100%).

However, it is extraordinary to make kneading with the filling rate of 100% by the use of the banbury mixer or the like, and it has been known that with the change in the filling rate, the quality and state of the kneaded plastic material are altered.

Despite these facts, the method of the non-patent document 1 can not be performed by setting the filling rate of the plastic material at different values than 100%. Indeed, it is almost impossible to make the kneading with the filling rate of 100%, therefore, the simulation results of the non-patent document 1 can not be verified through experiments.

On the other hand, the viscosity of a plastic material is largely different from the viscosity of air, therefore, if a two-phase of a plastic material and air in a chamber is simulated by making a flow calculation, the calculation tends to become unstable. In the case that the flow calculation is made by the use of the actual viscosity of the air, even if the calculation is completed without being interrupted, the computational time becomes very long and a high computational cost is required.

SUMMARY OF THE INVENTION

Therefore, the present invention was studied out to solve the above-mentioned problems, and an object of the present invention is to provide a computerized method for simulating a multiphase flow of a plastic material and a gas residing in a chamber, in which the multiphase flow calculation can be made stably at various filling rates without largely increasing the computational time and thereby accurate simulations are possible.

According to the present invention, a computerized method for simulating a fluidized state of a plastic material in a chamber, comprises a step of generating a chamber model which is a finite volume model of the chamber, a step of defining a material model of the plastic material, a step defining a gas-phase model of gas, a step of making a flow calculation of the material model and the gas-phase model which are in the chamber model, wherein the material model is provided with viscosity of the plastic material, and the gas-phase model is provided with viscosity which is more than the actual viscosity of the gas.

The chamber may be a kneading space of a banbury mixer in which at least one rotor is provided, and the plastic material may be an uncured rubber or resin material to be kneaded.

In the flow calculation, it is preferred that a calculation of shear heating of the material model is performed, but a calculation of shear heating of the gas-phase model is not performed.

On the interface between the plastic material model the chamber model, slip boundary conditions may be defined.

DESCRIPTION OF THE PREFERRED EMBODIMENTS

Embodiments of the present invention will now be described in detail in conjunction with accompanying drawings.

The present invention is directed to a simulating method for estimating fluidized states of a plastic material disposed in a chamber by the use of a computer (not shown).

The plastic material has viscosity like uncured rubber, resin or elastomer before cross-linked. However, it is not limited to these material. The plastic material may be any material as far as it has a stable fluidized state.

In the case of uncured rubber before cross-linked, a state of the mixture kneaded in good part at around 80 degrees C. may be regarded as a stable fluidized state.

Figure 1:
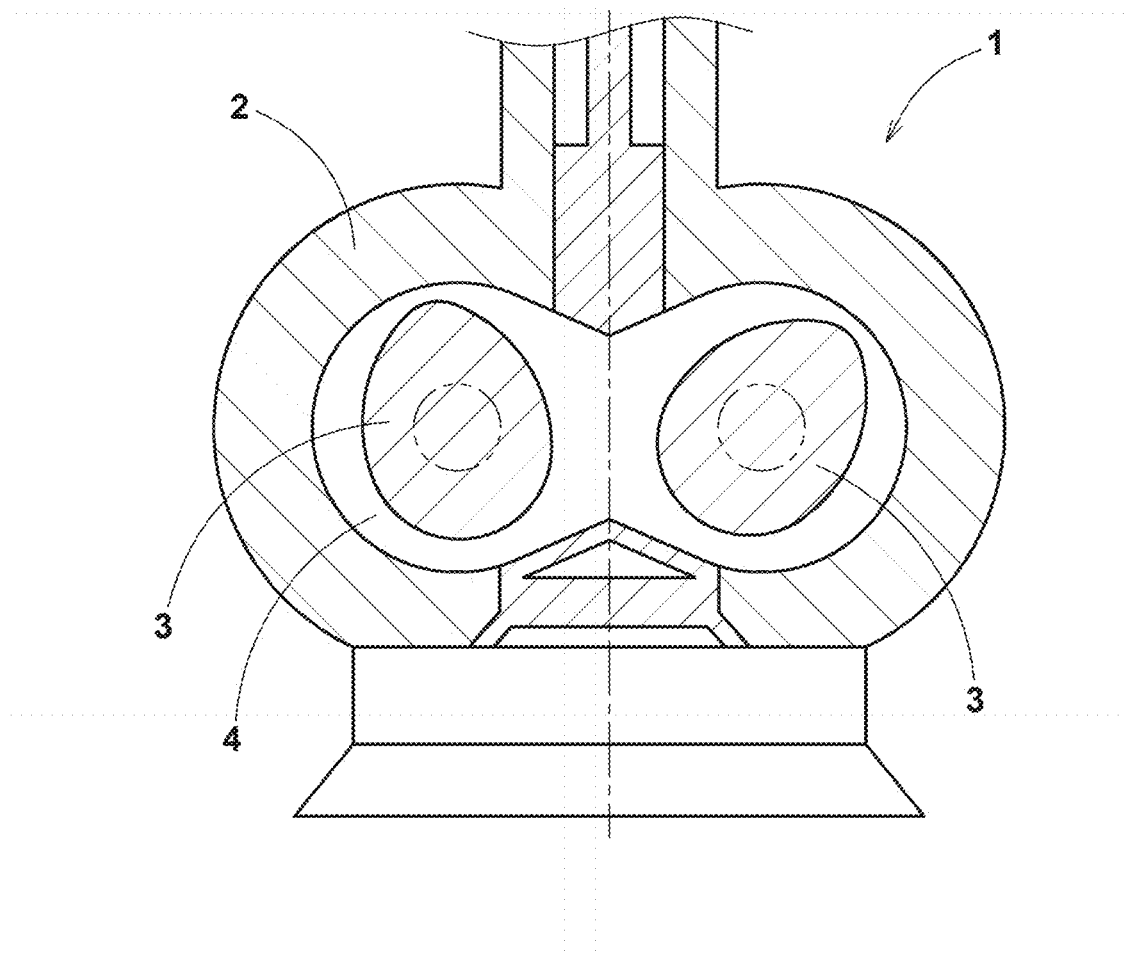
FIG. 1 is a schematic cross sectional view of a part of a banbury mixer for kneading a plastic material.

The chamber is a substantially closed space in which the plastic material is disposed and moved. The chamber may have any configuration. A typical example of the chamber is a kneading space of a banbury mixer. As shown in FIG. 1, the chamber 4 in this embodiment is formed between the casing 2 of the banbury mixer 1 and a pair of rotors 3 disposed in the casing 2 and has a sectional shape like a figure eight. The chamber is however, not limited to such configuration.

Figure 2:
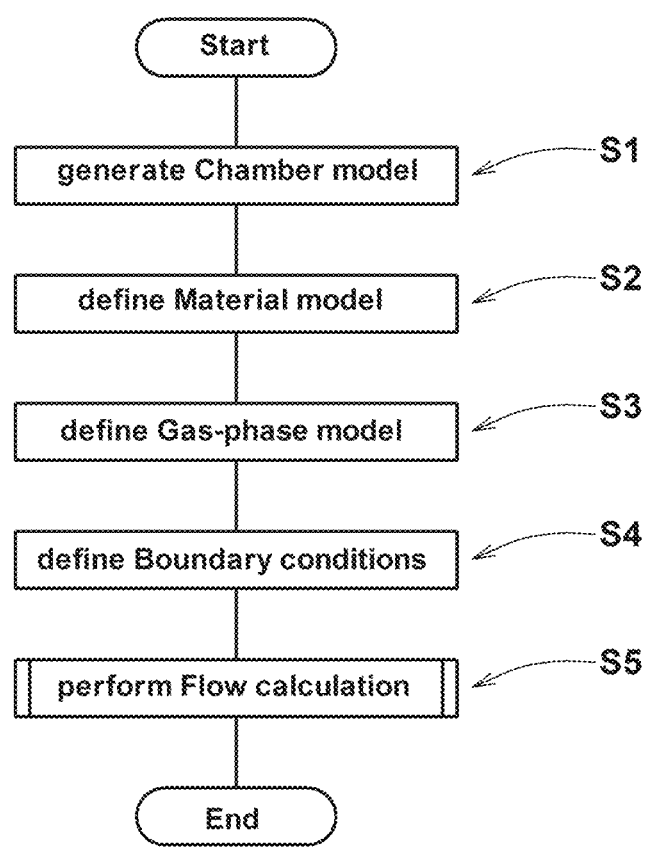
FIG. 2 is a flow chart of an example of the method according to the present invention.

FIG. 2 is a flowchart of an example of the simulating method according to the present invention.

* Step S1 of Generating Chamber Model

In this embodiment, first, the computer generates a chamber model 5 which is a finite volume model of the wall and the internal 3D space of the chamber 4.

Figure 3:
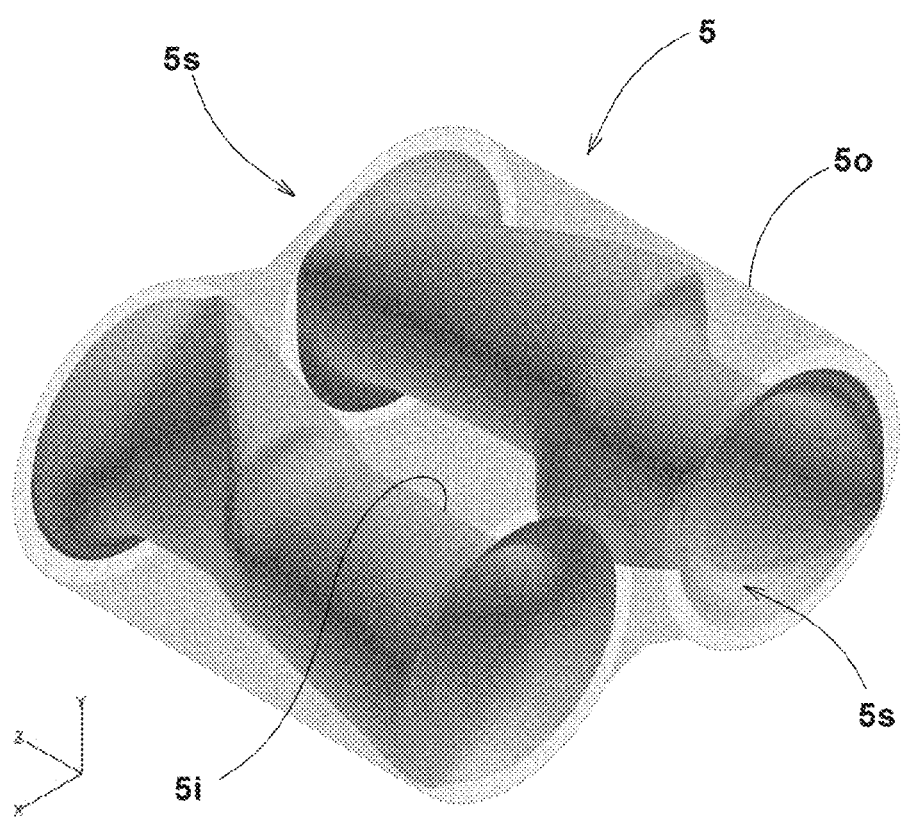
FIG. 3 is a perspective view of a chamber model.

FIG. 3 is a perspective view of the chamber model 5.

Figure 4:
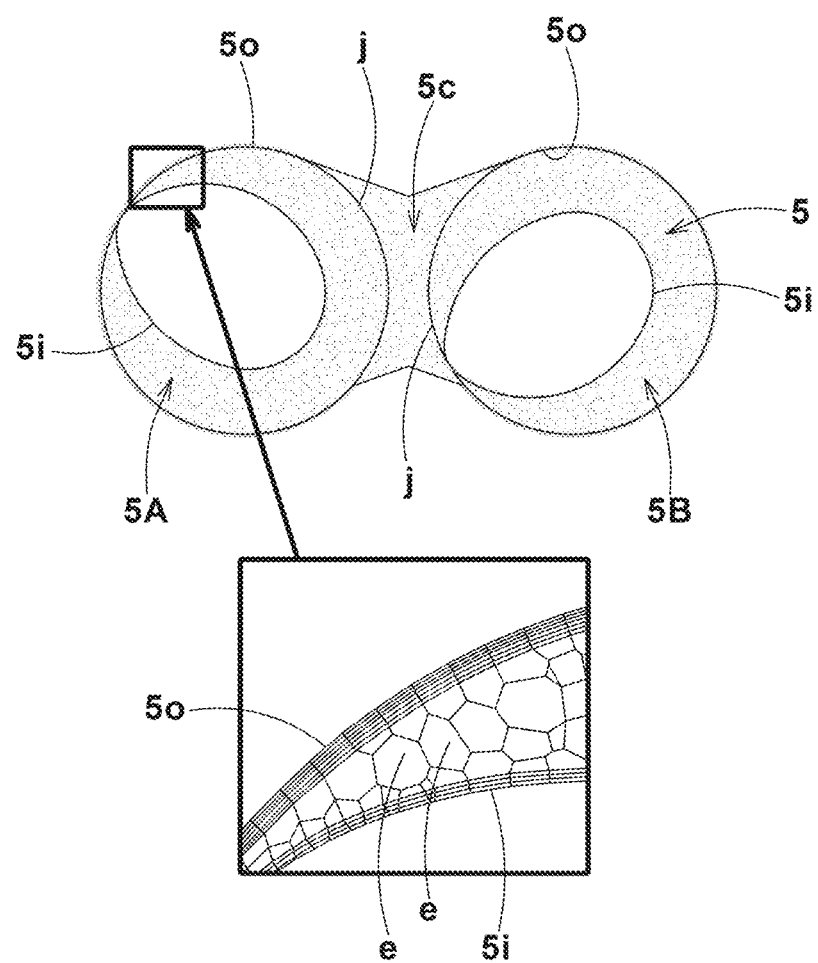
FIG. 4 is a cross sectional view for explaining the meshing of the walls and internal space of the chamber model.

FIG. 4 is a cross sectional view thereof.

The chamber model 5 has a three-dimensional space enclosed by an outside circumference surface 5o defined by the interior surface of the casing 2, an inside circumferential surface 5i defined by the outer circumference surfaces of the two rotating rotors 3, and two end surfaces 5s on both sides of the rotors 3 in the axial direction.

This three-dimensional closed space is divided (discretized) into the three-dimensional elements (e) such as tetrahedral elements, hexahedral elements and polyhedral elements. For each element, physical quantities of the plastic material (material model) such as pressure, temperature and/or velocity are computed.

The outside circumference surface 5o and the two end surfaces 5s are not moved. However, the inside circumferential surface 5i is moved according to the rotation of the rotors 3, and accordingly, the configuration of the chamber model 5 is changed.

Figure 5:
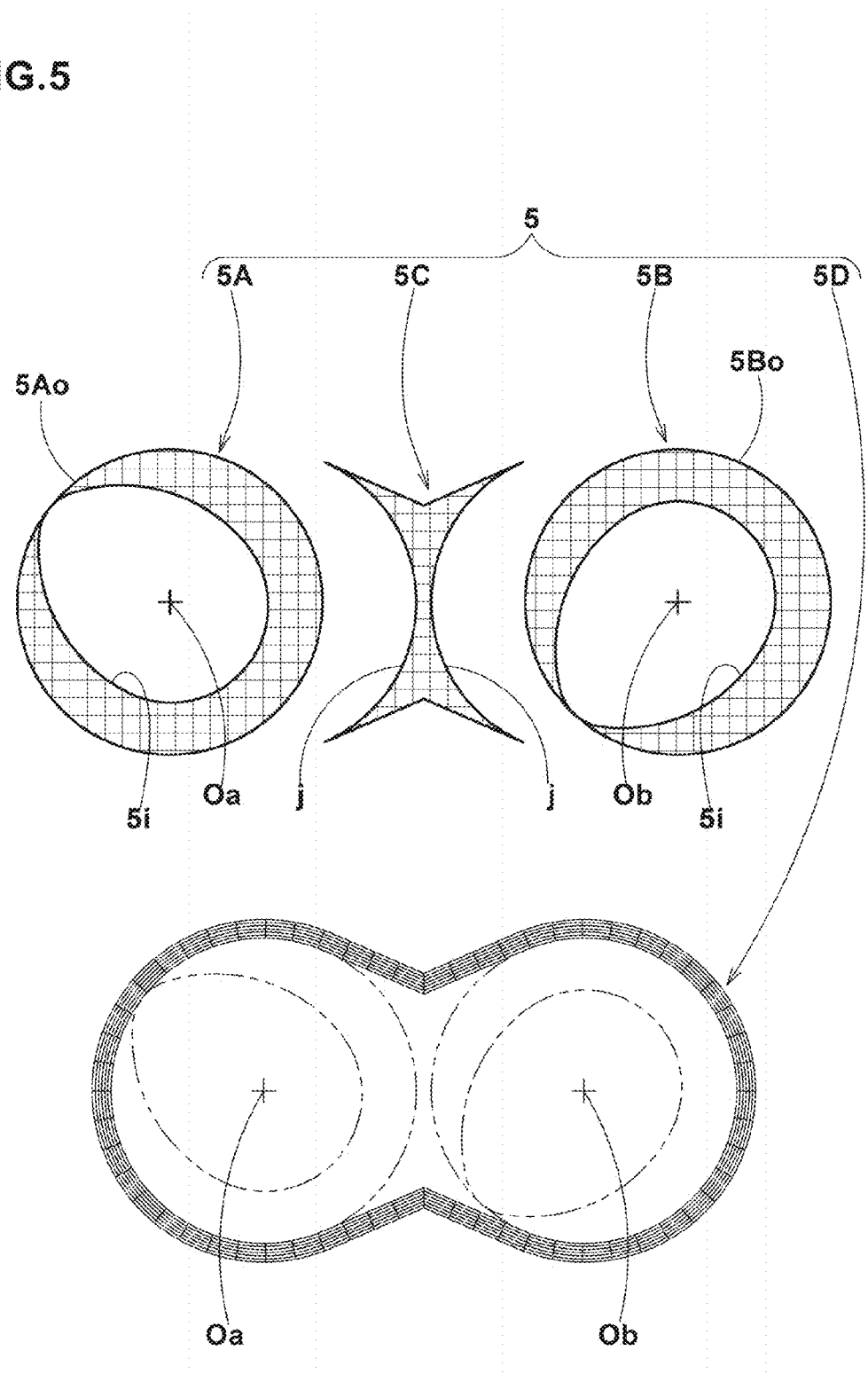
FIG. 5 is a cross sectional view showing functional parts of the chamber model separately.

In the example shown in FIG. 5, the chamber model 5 is composed of four functional parts: a pair of rotative parts 5A and 5B; an in-between part 5C sandwiched therebetween; and an outer frame part 5D surrounding these parts 5A, 5B and 5C.

Each rotative part 5A/5B is tubular and has a cylindrical circumference surface 5Ao/5Bo and an inside circumferential surface 5i corresponding to the circumference surface of one rotor 3.

The rotative parts 5A and 5B are placed in the outer frame part 5D and defined as rotatable around the respective center axes Oa and Ob to represent the change in the configuration of the volume of the chamber caused by the rotations of the rotors 3.

In contrast, the in-between part 5C remains at rest between the rotative parts 5A and 5B, and has two concave surfaces j abutting on the respective rotative parts 5A and 5B. On the concave surfaces j and the respective cylindrical circumference surfaces 5Ao and 5Bo, boundary conditions as sliding surface are defined.

This allows physical actions (force, heat, etc.) occurring in the rotative parts 5A and 5B to be transferred to the material model existing in the in-between part 5C through the concave surfaces j.

The outer frame part 5D is tubular and surrounds the rotative parts 5A and 5B and the in-between part 5C. Both of the axial ends thereof are closed by the two end surfaces 5s.

On the interface between the outer frame part 5D and the rotative parts 5A and 5B, and also the interface between the outer frame part 5D and the in-between part 5C, boundary conditions as sliding surface are defined.

This allows physical actions (force, heat, etc.) occurring in the rotative parts 5A and 5B to be transferred to the outer frame part 5D through the interfaces therebetween.

The outer frame part 5D is subjected to a relatively large shearing force by the operation of the rotors. Therefore, in order to calculate the velocity and the like of the material in more detail, the elements constituting the outer frame part 5D are made smaller in size than those of the rotative parts 5A and 5B and the in-between part 5C. Thereby, velocity profile and the like of the material model near the interior surface of the chamber model 5 can be calculated in more detail.

* Step S2 of Defining Material Model

Next, the material model is defined by the computer and stored. The material model is a model of the plastic material flowing or moving in the chamber 4.

On the material model, physical properties of the plastic material such as shear viscosity, specific heat, thermal conductivity and specific gravity are defined and stored in the computer.

As described above, the plastic material in this embodiment is a rubber mixture in a plasticized state, therefore, physical properties of such rubber mixture are entered and stored in advance.

[Shear Viscosity]

In order to obtain the shear viscosity, firstly, viscoelastic properties (G' and G") of the plastic material are measured under plural temperature conditions. Then, according to the Cox-Merz rule, the measured viscoelastic properties are converted into the shear viscosity.

The shear viscosity obtained as above is approximated by the following expression (1) according to a power law.

$$\eta = m\gamma'^{n-1} \qquad \text{Expression (1):}$$

wherein,
η: shear viscosity,
m: a coefficient as a function of absolute temperature,
γ': a shear velocity, and
n: a coefficient.

The specific heat of the analysis object (plastic material) can be obtained by the thermally-insulated continuous-heating method (@ 25 degrees C.), and the measured specific heat value is entered and stored in the computer in advance.

The thermal conductivity of the analysis object (plastic material) can be obtained by the hot wire method (@ 25 degrees C.), and the measured value is entered and stored in the computer in advance.

* Step S3 of Defining Gas-Phase Model

Next, a gas-phase model is defined by the computer and stored. The gas-phase model is a model of gas existing in the chamber.

In the present invention, the filling rate of the plastic model in the chamber is less than 100%, therefore, in order to enable flow calculations, the part not filled with the plastic model, is filled with the gas-phase model.

The gas-phase model in this example is provided with viscosity and specific gravity.

The specific gravity of the gas-phase model is set at the actual value of the specific gravity of the gas.

However, The viscosity of the gas-phase model is set at a value more than the actual value of the viscosity of the gas by the computer.

When the filling rate of the plastic material in the chamber is less than 100%, it is necessary to perform a flow calculation for a multiphase flow of the plastic material and the gas.

Usually, a difference in the viscosity between a gas and a plastic material is very large. Therefore, if the calculation is made taking the shear heating due to the velocity into consideration, the shear heating is extraordinarily increased at the interface between the gas-phase model and the material model, and as a result, the calculation is liable to become unstable.

According to the present invention, therefore, in order to make the calculation stable, the viscosity of the gas-phase model is increased as much as possible within a range which does not impact negatively on the calculated results. As a result, it becomes possible to increase the time intervals (time increment) in the simulation to speed up the computation.

Changing the viscosity of the gas-phase model only, simulations were made by the present inventors in order to compare the pressure field in the chamber model 5.

As a result, it was found that, if the viscosity of the gas-phase model exceeds 10 times the actual viscosity, then the pressure in the chamber model 5 becomes increased and adversely affects the pressure field.

However, if the viscosity of the gas-phase model is less than 5 times the actual viscosity, then it becomes difficult to make the calculation stable.

Therefore, it is preferable that the viscosity of the gas-phase model is set in a range of from 5 to 10 times the actual viscosity of the gas.

* Step S4 of Defining Boundary Conditions

Next, various conditions including boundary conditions necessary for the flow calculation are defined. The boundary conditions may include flow velocity boundary conditions and temperature boundary conditions at the surface of the chamber model 5.

As to the flow velocity boundary conditions,
(a) wall-surface non-slip condition, or
(b) wall-surface slip condition
may be defined according to the purpose of the simulation, required accuracy and the like.

In the case of the wall-surface non-slip condition, the flow velocity of the material model at the surface of the chamber model 5 is always zero.

In the case of the wall-surface slip condition, the flow velocity of the plastic model at the surface of the chamber model 5 may have non-zero values as well as zero value.

In this case, the following expression (2) (Navier's Law) can be applied to slip phenomena at the interface between the material model and the chamber model 5.

$$f_s = -F_{slip}(v_{wall} - v_s)|v_s - v_{wall}|^{eslip-1}$$ Expression (2):

$$\tau_\omega = F_{slip}[v_{slip} - v_{wall}]$$ Expression (2)':

wherein
$f_s$: shear stress of the material model at the surface of the chamber model 5,
$v_{slip}$: slip velocity (tangent velocity) of the material model at the surface of the chamber model 5,
$v_{wall}$: tangent velocity of the material model at the surface of the chamber model 5,
$F_{slip}$, eslip: materials properties (if eslip=1 then linear: if 0<eslip<1 then power law).

In order to define the slip velocity $v_{slip}$ of the material model at the surface of the chamber model 5, firstly, the velocity field in initial stage is obtained, then from the velocity field (or corrected velocity field), the shear stress of the material model at the surface of the chamber model 5 is obtained, then the slip velocity of the material model at the surface of the chamber model 5 is obtained by the above-mentioned expression (2).

On this occasion, if needed, in order to control an abrupt increase in the slip velocity, it is preferred that the wall-surface slip velocity of each surface of the chamber model 5 is gradually converged to the true value during the loop of the conventional SIMPLE algorithm, by multiplying the slip velocity by a relaxation coefficient less than 1. (after-mentioned)

As to the temperature boundary conditions,
(a) thermally insulated condition in which the heat does not escape outside from the chamber model 5 through the surface thereof, or
(b) condition in which the entire surface of the chamber model 5 has a constant temperature (for example 50 degrees C.) may be defined.

Further, the conditions may include the initial temperature of the plastic model (in this embodiment 20 degrees C. (293K)), the number of rotations of the rotors presented by the number of rotations of the rotative parts 5A and 5B, the slip ratio of the surface of the chamber model 5, the filling rate of the plastic model with respect to the volume of the chamber model 5 and the like.

Furthermore, the conditions may include an initial state of the flow calculation, time intervals for calculations, the number of iterations in the internal processing, the maximum period of computation and the like.

Figure 6:
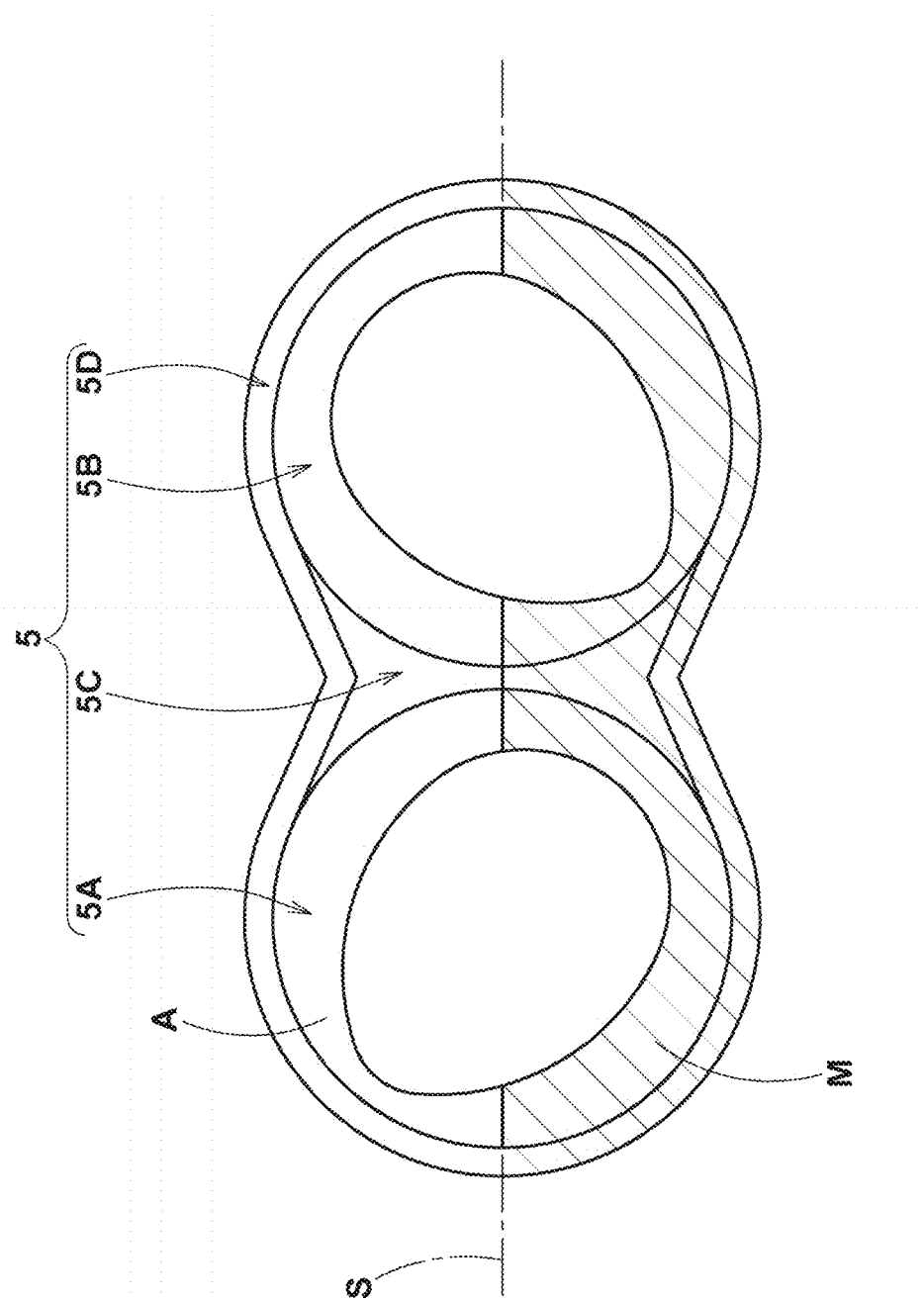
FIG. 6 is a cross sectional view showing a state of the chamber model in which a material model and a gas-phase model are arranged.

As to the initial state, for example as shown in FIG. 6, it is possible to define such that
the domain A on the upper side of a horizontal interface S defined as extending across the chamber model 5 is of the gas-phase model, and
the domain M on the under side of the horizontal interface S is of the material model.

Therefore, by changing the level of this interface S, the filling rate of the plastic material (material model) can be adjusted. These conditions may be defined arbitrary according to an objective of the simulation.

* Step S5 of Performing Flow Calculation

Next, the material model and the gas-phase model are defined in the chamber model 5, and a flow calculation is made based on the above-mentioned conditions.

In the flow calculation, velocity components in three coordinate axes directions (x, y, z) which specify the motional state of the material model, and
the temperature T and the pressure p which specify the internal state of the material model are computed. Thus, unknowns to be solved are these five physical quantities.

The flow calculation in this embodiment is performed by the use of the Navier-Stoks equation for an incompressibility flow, setting the density of each of the material model and the gas-phase model at a constant value.

In this embodiment, the material model is treated as fluid throughout the possible temperature range.

Therefore, a Navier-Stoks equation, an equation for conservation of mass and an energy equation have to be solved as simultaneous equations of fluid.

In this embodiment, in order to deal with a multiphase flow of the gas and plastic material, the VOF (volume of Fluid) method, which is used to calculate the flow of a free interface, is employed. The VOF method is not to directly calculate the motion of the interface between two kinds of fluid. In the VOF method, a free interface is expressed by defining a filling rate (volume fraction) of each fluid within the volume of each element.

The government equations are is as follows.
[Motion Equation]

In the this embodiment, a two-phase flow in which the gas-phase model and the material model flow together in the chamber model 5 is treated as a single phase flow.

In this case, the motion equation to be solved is the following expression (3) in the three coordinate axes directions x, y and z. This becomes possible as a result of that the two phases are averaged by the VOF method and treated as a single phase.

$$\frac{\partial}{\partial t}(\rho \vec{u}) + \nabla \cdot (\rho \vec{u}\vec{u}) = -\nabla p + \nabla \cdot [\mu(\nabla \vec{u} + \nabla \vec{u}^T)] + \rho \vec{g} + \vec{F}$$ Expression (3)

wherein
u: velocity of the multiphase flow model,
p: pressure of multiphase flow model,
ρ: density of the multiphase flow model,
g: gravitational acceleration,
T: absolute temperature of the multiphase flow model,
F: external force.

The values of the density ρ and coefficient of viscosity μ in the vicinity of the interface between the material model and the gas-phase model which are used herein, are weighted by the occupied volumes of the respective phases, namely the material model and gas-phase model and then averaged as shown in the following expression (4).

$$\rho = \Sigma \alpha_q \rho_q \quad \mu = \Sigma \alpha_q \mu_q$$ Expression (4):

wherein $\alpha_q$: volume fraction of each phase in each element $\rho_q$ density of each phase in each element $\mu_q$: viscosity of each phase in each element

[Equation for Conservation of Mass]

As to the equation for conservation of mass (equation of continuity) and pressure equation, it is enough to solve only one set of equations in the three coordinate axes directions. Therefore, according to the simulating method in this embodiment, the computer can calculate the flow field as a shingle phase despite the multiphase. In other words, to be solved is the flow in which the materials properties are varied with position (volume fraction).

The position of each phase can be estimated according to the distribution of the volume fraction obtained as the result of the calculation.

[Energy Equation]

The temperature of the material model can be obtained by the following energy equation (5).

$$\frac{\partial}{\partial t}(\rho E) + \nabla \cdot (\vec{u}(\rho E + p)) = \nabla \cdot (k_{eff} \nabla T) + S_h \qquad \text{Equation (5)}$$

$$E = \frac{\sum_{q=1}^{n} \alpha_q \rho_q E_q}{\sum_{q=1}^{n} \alpha_q \rho_q}$$

wherein

E: enthalpy, k: thermal conductivity,

S: source term.

[Transport Equation of Volume Fraction]

The distribution of the volume fraction determines the position of the interface between the two phases (or the gas-phase model and material model).

The volume fraction $\alpha q$ can be obtained by accurately solving the following expression (6).

$$\frac{\partial}{\partial t}(\alpha_q \rho_q) + \nabla \cdot (\alpha_q \rho_q \vec{u}_q) = S_{\alpha q} \qquad \text{Expression (6)}$$

If the volume fraction $\alpha q=0$ in an arbitrary element (e), this means that the q phase (q phase: material model) does not exist in this element (e).

If the volume fraction $\alpha q=1$, this means that the entire volume of the element (e) is filled with the q phase.

If $0<\alpha q<1$, this means that the element (e) is filled with the q phase and other phase (gas-phase model), that is, the element is multiphase having an interface.

This equation can be solved by modified-HRIC (Implicit) of which detailed description is given by "ANSYS Fluent user's Manual, 26.2.9 Modified HRIC scheme."

In this embodiment, each of the above-mentioned equations is solved by the pressure-based partitioned method.

For the coupling of the pressure equation and the motion equation, the SIMPLE (semi-Implicit Method for Pressure-Linked Equations) algorithm is preferably used.

Figure 7:
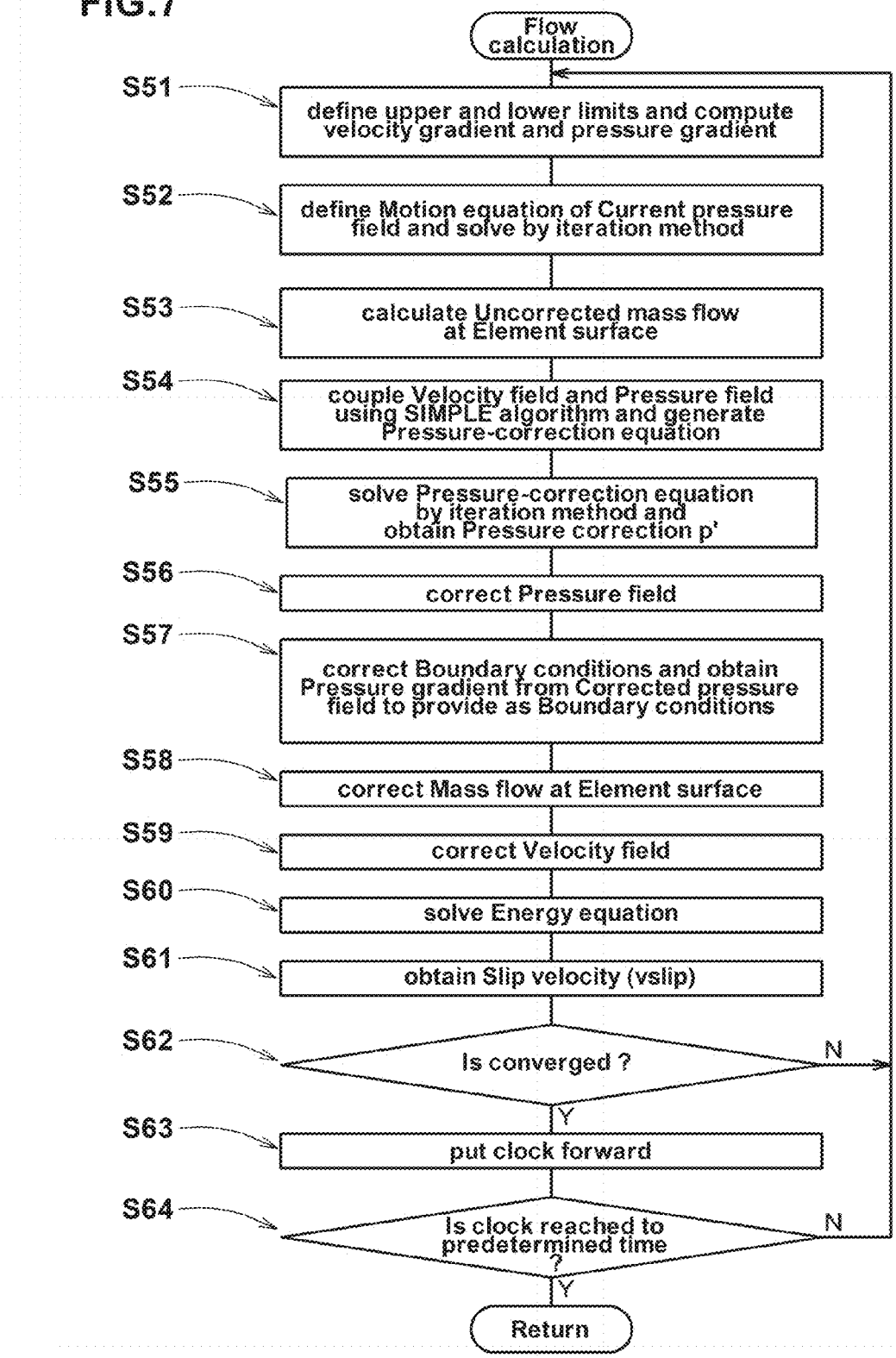
FIG. 7 is a flow chart of a procedure of the flow calculation.

FIG. 7 shows a flowchart of an example of the flow calculation performed by the computer.

** Step S51

In this example, firstly, upper and lower limits for the pressure gradient and the velocity are set, and the velocity gradient and the pressure gradient are computed.

** Step S52

Next, the motion equation is defined by discretization of the current pressure field, and the motion equation is solved by a method of iteration. That is, the velocity of the material model (or multiphase) in three coordinate axes directions is computed. As to the method of iteration, the Gauss-Seidel method can be used.

** Step S53

Next, in order to examine whether or not the above-mentioned velocity satisfies the equation for conservation of mass, uncorrected mass flow of the material model at the surfaces of the elements of the chamber model 5 is calculated first. Here, the "uncorrected mass flow" is a mass flow temporarily used at the beginning of the loop of the SIMPLE algorithm. Such mass flow may have a large error, therefore, it is called "uncorrected mass flow".

The mass flow is necessary for determining whether the law of conservation of mass is satisfied or not.

** Step S54

Next, using the SIMPLE algorithm, the velocity field and the pressure field are coupled, and the following pressure-correction equation for correcting the pressure field is generated.

$$\nabla[k\nabla\phi]=src$$

** Step S55

Next, by the method of iteration for example AMG solver, CG or Bi-CG and the like, the pressure-correction equation is solved, and a pressure correction amount p' is computed.

** Step S56

Next, based on the obtained solution, the pressure field is corrected by the following expression:

$$p^{n+1}=p^n+\omega p'$$

wherein p: pressure, n: current number of time step $\omega$: relaxation coefficient which is 0.3 in this example.

** Step S57

Next, the boundary conditions of the interface are corrected (or updated). Specifically, from the corrected pressure field, the pressure gradient is obtained. The obtained pressure gradient is provided as the boundary conditions.

** Step S58

Next, the mass flow of at the surfaces of the elements is corrected by the following expression:

$$mf^{n+1}=mf^*+m'f$$

wherein, $mf^{n+1}$: corrected mass flow at the surfaces of the elements, $mf^*$: uncorrected mass flow at the surfaces of the elements, m'f: correcting value of mass flow.

** Step S59

Next, the velocity field is corrected by the following expression:

$$v^{n+1}=v^*-(V\nabla p'/\partial pV)$$

wherein v: volume of element, v*: intermediary velocity field before corrected, obtained from motion equation, $\nabla p'$: gradient of pressure correction amount, $\partial pV$: diagonal component of matrix of motion equation,

** Step S60

Next, by solving the above-mentioned energy equation (5), the temperature and viscosity of the material model are calculated.

** Step S61

Further, the slip velocity $v_{slip}$ of the wall-surface of the chamber model 5 is calculated by the following expression (7).

$$v_{slip} = \frac{\tau_w}{F_{slip}} + v_{wall} \qquad \text{Expression (7)}$$

wherein, $\tau_w$: wall-surface shear stress, $v_{slip}$: the slip velocity of the material model at the surface of the chamber model 5, $v_{wall}$: the tangent velocity of the material model at the surface of the chamber model 5, $F_{slip}$: materials properties (coefficient) expressing the tendency to slip. If the value becomes increased, it becomes the wall-surface non-slip condition.

** Step S62

Next, it is judged if the solution of this calculation is converged. The criteria of the judgment for convergence are defined beforehand.

** Step S63

If judged as being converged (Y in step S62), the time step is incremented by one to put a clock forward by one time interval.

The convergence can be judged, based on whether the total number of the corrected mass flows is within a predetermined error range or not.

If the clock is not reached to the predetermined time (N in step S64), then the computer again performs the step S51 and subsequent steps.

On the other hand, in the step S62, if it is judged as being not converged, then the computer again performs the step S51 and subsequent steps.

In the flow calculations in this embodiment, the shear heating of the material model is calculated, but the shear heating of the gas-phase model is not calculated. The shear velocity of the material model is relatively large, therefore, the shear heating needs to be calculated.

The shear velocity often becomes increased at the interface between the material model and the gas-phase model.

The shear heating is proportional to the shear viscosity multiplied by the square of the shear velocity, therefore, there is a possibility that an abnormally large value of the shear velocity adversely affects the calculation of the temperature (energy equation).

Therefore, in this embodiment, the calculation of the shear heating is limited to only the material model.

More specifically, the calculation is performed with respect to only some of the elements of the chamber model 5 in which the value of the volume fraction $\alpha q$ of the material model is not less than a constant value (in this embodiment, 0.90).

In this embodiment, the wall-surface slip condition is defined on the interface between the surfaces of the material model and the chamber model 5.

In this embodiment, the slip velocity is given to the material model little by little as follows.

The motion equation defined based on the current pressure field is solved by the computer to obtain the shear stress.

From the obtained shear stress, the wall-surface slip velocity $v_{slip}$ to be set is calculated by the use of the expression (7) (the above-mentioned step S61).

In the next step, if the calculated slip velocity $v_{slip}$ is given to the interface as it is, there is a possibility that the wall-surface shear stress $\tau w$ given by the expression (2)' becomes an abnormal value, and thereby an abnormal slip velocity is defined on the wall-surface.

Therefore, it is desirable that, as shown in the following expression (8), a relaxation coefficient $\beta$ is provided, and the slip velocity is gradually increased up to the target value by changing the relaxation coefficient $\beta$.

$$v_{slip}^n = v_{slip}^{n-1} + \beta(v_{slip}^n - v_{slip}^{n-1})$$

$$v_{slip}^0 = 0 \qquad \text{Expression(8):}$$

wherein $0 < \beta < 1$, n: number of repetitions of calculation.

Then, by the use of the SIMPLE algorithm or the like, the computer performs the coupling of the pressure field and the velocity field to which the calculated slip velocity $v_{slip}$ is given, and the pressure-correction equation for correcting the pressure field is generated (the above-mentioned step S52).

Comparison Tests

In order to confirm the effects of the present invention, flow simulations of plastic material were made based on the chamber model shown in FIG. 3 and conditions shown in Table 1. With respect to the distribution, dispersion and temperature of the kneaded material and the rotors' torque, the computational accuracy was evaluated into three ranks, wherein rank 1 means good, and ran 3 means bad. The results are shown in Table 1.

TABLE 1

|  | Ref. | Ex. 1 | Ex. 2 | Ex. 3 |
|---|---|---|---|---|
| time intervals (msec) | 1.973 | 1.973 | 1.973 | 1.973 |
| plastic material filling rate | 70% | 70% | 70% | 70% |
| gas-phase model viscosity (Pa · s) | 1.79E−05 | 8.95E−05 | 1.79E−04 | 1.89E−04 |
| (times actual viscosity) | 1.00 | 5.00 | 10.00 | 10.56 |
| calculated shear heating | only material model | only material model | only material model | only material model |
| wall-surface slip Fslip | 6.0E+5 | 6.0E+5 | 6.0E+5 | 6.0E+5 |
| distribution | 3 | 1 | 1 | 1 |
| dispersion | 3 | 1 | 1 | 1 |
| rotors torque | 3 | 1 | 1 | 3 |
| plastic material temperature | 3 | 1 | 1 | 1 |
| computational time | 2 weeks | 2 weeks | 2 weeks | 2 weeks |

From the test results, it was confirmed that according to the present invention, the computational accuracy is remarkably improved while maintaining the computational time.

Figure 8:
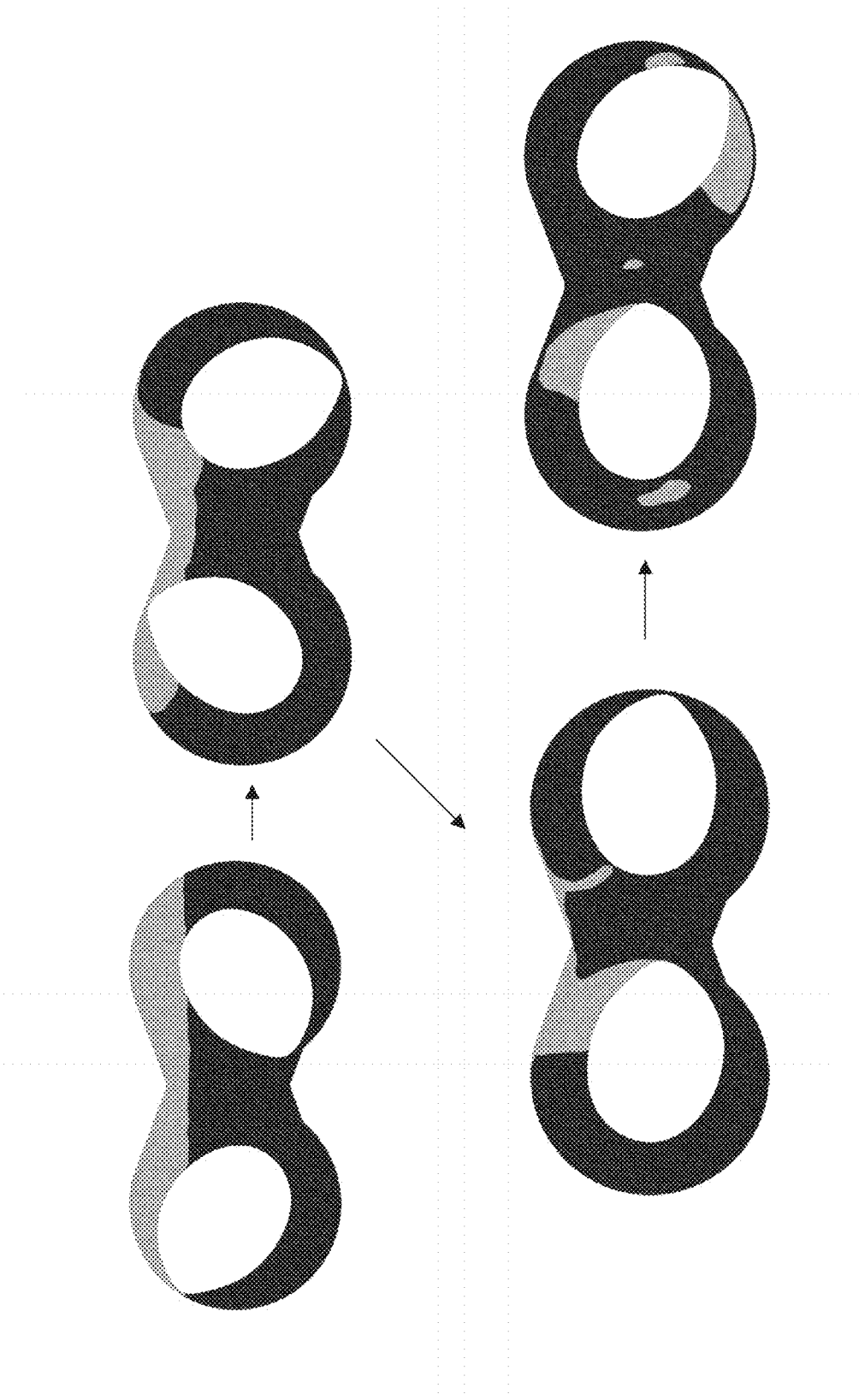
FIG. 8 is a diagram showing kneaded states of the plastic material obtained by the simulating method according to the present invention.

FIG. 8 shows a temporal alteration of the state of the kneaded plastic material obtained through a kneading simulation which was made, starting from the initial state shown in FIG. 6, by the method according to the present invention. In FIG. 8, the solid black part indicates the plastic material.

As explained, according to this embodiment, the kneaded states of a plastic material can be accurately simulated, and the simulation results can be output visually.

The invention claimed is:

1. A computerized method for simulating a fluidized state of a plastic material in a chamber, comprising a step of generating a chamber model which is a finite volume model of the chamber, a step of defining a material model of the plastic material, a step defining a gas-phase model which is a model of gas existing in the chamber, a step of making a flow calculation of the material model and the gas-phase model which are in the chamber model, wherein the material model is provided with viscosity of the plastic material, and the gas-phase model is provided with viscosity which is in a range of from 5 to 10 times the actual viscosity of the gas, in the step of making the flow calculation, a VOF (Volume of Fluid) method is used so that a two-phase flow of the gas-phase model and the material model which flow together in the chamber model is treated as a single phase flow whose viscosity and density are weighted by occupied volumes of the respective phases and averaged, and in the flow calculation, shear heating is calculated with respect to only some of the elements of the chamber model in which a volume fraction of the material model is not less than 0.90.

2. The computerized method according to claim 1, wherein the chamber is a kneading space of a banbury mixer in which at least one rotor is provided, and the plastic material is an uncured rubber or resin material to be kneaded.

3. The computerized method according to claim 1, wherein slip boundary conditions are defined on the interface between the plastic material model and the chamber model.

4. The computerized method according to claim 2, wherein slip boundary conditions are defined on the interface between the plastic material model and the chamber model.

* * * * *